United States Patent
Kang et al.

(10) Patent No.: US 11,888,212 B2
(45) Date of Patent: Jan. 30, 2024

(54) ANTENNA MODULE AND ELECTRONIC DEVICE INCLUDING THE SAME

(71) Applicant: Samsung Electro-Mechanics Co., Ltd., Suwon-si (KR)

(72) Inventors: Ho Kyung Kang, Suwon-si (KR); Shin Haeng Heo, Suwon-si (KR); Hyung Ho Seo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 76 days.

(21) Appl. No.: 17/356,869

(22) Filed: Jun. 24, 2021

(65) Prior Publication Data

US 2021/0320398 A1    Oct. 14, 2021

Related U.S. Application Data

(63) Continuation of application No. 17/151,912, filed on Jan. 19, 2021, which is a continuation of application
(Continued)

(30) Foreign Application Priority Data

Aug. 5, 2019    (KR) .......................... 10-2019-0094913

(51) Int. Cl.
*H01Q 1/24* (2006.01)
*H01L 23/13* (2006.01)
(Continued)

(52) U.S. Cl.
CPC ............ *H01Q 1/243* (2013.01); *H01L 23/13* (2013.01); *H01L 23/3121* (2013.01);
(Continued)

(58) Field of Classification Search
CPC .. H01Q 1/243; H01Q 21/0006; H01Q 21/065; H01Q 1/2283; H01Q 1/38;
(Continued)

(56) References Cited

U.S. PATENT DOCUMENTS

2008/0042266 A1* 2/2008 Kagaya ............... H01L 23/5227
257/E23.125
2012/0206301 A1* 8/2012 Flores-Cuadras ...... H01Q 5/357
343/700 MS
(Continued)

FOREIGN PATENT DOCUMENTS

JP    2005-347912 A    12/2005
JP    5545371 B2    7/2014
(Continued)

OTHER PUBLICATIONS

Korean Office Action dated Feb. 24, 2022, in counterpart Korean Patent Application No. 10-2020-0087978 (2 pages in English and 2 pages in Korean).
(Continued)

*Primary Examiner* — Md K Talukder
(74) *Attorney, Agent, or Firm* — NSIP Law

(57) ABSTRACT

An antenna module includes a first antenna unit including at least one first patch antenna pattern, at least one first feed via, and at least one first dielectric layer, a second antenna unit including at least one second patch antenna pattern, at least one second feed via, and at least one second dielectric layer, a first connection portion, a first rigid substrate electrically connecting the first connection portion to the first antenna unit and having a first surface on which the first antenna unit is disposed, a base connection portion, a flexible substrate having a first surface on which the first connection portion is disposed and a second surface on which the base connection portion is disposed, and an IC electrically connected to the flexible substrate through the second surface of the flexible substrate or the first rigid substrate.

23 Claims, 14 Drawing Sheets

Related U.S. Application Data

No. 16/742,127, filed on Jan. 14, 2020, now Pat. No. 10,931,000.

(51) Int. Cl.

| | | |
|---|---|---|
| *H01L 23/31* | (2006.01) | |
| *H01L 23/498* | (2006.01) | |
| *H01L 23/552* | (2006.01) | |
| *H01L 23/66* | (2006.01) | |
| *H01Q 21/00* | (2006.01) | |
| *H01Q 21/06* | (2006.01) | |

(52) U.S. Cl.
CPC .... *H01L 23/4985* (2013.01); *H01L 23/49822* (2013.01); *H01L 23/49833* (2013.01); *H01L 23/552* (2013.01); *H01L 23/66* (2013.01); *H01Q 21/0006* (2013.01); *H01Q 21/065* (2013.01); *H01L 2223/6616* (2013.01); *H01L 2223/6677* (2013.01)

(58) Field of Classification Search
CPC ...... H01Q 9/0414; H01Q 21/28; H01Q 25/00; H01Q 1/36; H01Q 1/50; H01Q 5/00; H01Q 21/00; H01Q 21/06; H01Q 9/0407; H01L 23/13; H01L 23/3121; H01L 23/49822; H01L 23/49833; H01L 23/4985; H01L 23/552; H01L 23/66; H01L 2223/6616; H01L 2223/6677
See application file for complete search history.

(56) References Cited

U.S. PATENT DOCUMENTS

| | | | | |
|---|---|---|---|---|
| 2013/0112754 | A1 | 5/2013 | Ikemoto | |
| 2014/0133151 | A1* | 5/2014 | Kamada | F21V 7/30 362/249.08 |
| 2014/0357196 | A1* | 12/2014 | Mayor | H04B 17/21 455/67.11 |
| 2015/0147980 | A1* | 5/2015 | Larsen | H01Q 5/314 343/745 |
| 2016/0006123 | A1* | 1/2016 | Li | G06K 19/07777 343/867 |
| 2017/0040702 | A1* | 2/2017 | West | H01Q 11/105 |
| 2017/0047547 | A1* | 2/2017 | Son | H10K 50/8426 |
| 2017/0070204 | A1* | 3/2017 | McIntyre | H03H 9/02275 |
| 2018/0062263 | A1 | 3/2018 | Ueda | |
| 2018/0084644 | A1* | 3/2018 | Matsuda | H05K 1/147 |
| 2018/0135841 | A1* | 5/2018 | Yonezawa | G02F 1/133603 |
| 2018/0254555 | A1* | 9/2018 | Sotoma | H01Q 21/28 |
| 2019/0027804 | A1 | 1/2019 | Kim et al. | |
| 2019/0033387 | A1* | 1/2019 | Ito | H01M 10/482 |
| 2019/0036207 | A1 | 1/2019 | Kim et al. | |
| 2019/0103653 | A1* | 4/2019 | Jeong | H01L 23/645 |
| 2019/0113609 | A1* | 4/2019 | Baheti | H01Q 1/38 |
| 2019/0123438 | A1* | 4/2019 | Mizunuma | H01Q 21/062 |
| 2019/0207323 | A1 | 7/2019 | Joung et al. | |
| 2020/0106192 | A1* | 4/2020 | Avser | H01Q 1/405 |
| 2020/0136238 | A1 | 4/2020 | Iwata | |
| 2020/0235478 | A1* | 7/2020 | Kitamura | H01Q 9/0457 |
| 2021/0013624 | A1 | 1/2021 | Kim et al. | |
| 2021/0022255 | A1* | 1/2021 | Yosui | H05K 3/4691 |

FOREIGN PATENT DOCUMENTS

| | | |
|---|---|---|
| JP | 2018-33078 A | 3/2018 |
| JP | 2019-004241 A | 1/2019 |
| JP | 2019-29669 A | 2/2019 |
| KR | 10-2019-0009232 A | 1/2019 |
| KR | 10-2019-0013381 A | 2/2019 |
| KR | 10-2019-0013382 A | 2/2019 |
| KR | 10-2019-0080699 A | 7/2019 |

OTHER PUBLICATIONS

Korean Office Action dated Aug. 27, 2021, in counterpart Korean Patent Application No. 10-2020-0087978 (5 pages in English and 4 pages in Korean).
Non-Final Office Action dated Jan. 3, 2023, in related U.S. Appl. No. 17/151,912 (12 pages in English).
United States Office Action dated Apr. 25, 2023, in U.S. Appl. No. 17/151,912 (15 Pages in English).
U.S. Office Action dated Aug. 10, 2023, in related U.S. Appl. No. 17/151,912 (15 pages).

* cited by examiner

ANTENNA MODULE AND ELECTRONIC DEVICE INCLUDING THE SAME

CROSS-REFERENCE TO RELATED APPLICATIONS

This application is a Continuation Application of U.S. patent application Ser. No. 17/151,912 filed on Jan. 19, 2021, which is a Continuation Application of U.S. patent application Ser. No. 16/742,127 filed on Jan. 14, 2020, now U.S. Pat. No. 10,931,000 issued on Feb. 23, 2021, which claims the benefit under 35 USC 119(a) of Korean Patent Application No. 10-2019-0094913 filed on Aug. 5, 2019, in the Korean Intellectual Property Office, the entire disclosures of which are incorporated herein by reference for all purposes.

BACKGROUND

1. Field

The following description relates to an antenna module and an electronic device including the same.

2. Description of Background

Mobile communications data traffic is increasing rapidly on a yearly basis. Technological development to support such a leap in data in real time data traffic in wireless networks is actively underway. For example, applications of the contents of Internet of Things (IoT) based data, live VR/AR in combination with augmented reality (AR), virtual reality (VR), and social networking services (SNS), autonomous navigation, a synch view for real-time image transmission from a user's view point using a subminiature camera, and the like, require communications for supporting the exchange of large amounts of data, for example, 5th generation (5G) communications, millimeter wave (mmWave) communications, or the like.

Thus, millimeter wave (mmWave) communications including 5G communications have been actively researched, and research into the commercialization/standardization of antenna modules to smoothly implement such millimeter wave (mmWave) communications have been actively undertaken.

Radio frequency (RF) signals in high frequency bands of, for example, 28 GHz, 36 GHz, 39 GHz, 60 GHz and the like, are easily absorbed in the course of transmission and lead to loss. Thus, the quality of communications may deteriorate sharply. Therefore, antennas for communications in high frequency bands require a different technical approach from related art antenna technology, and may require special technological development, such as for separate power amplifiers or the like, to secure antenna gain, integrate an antenna and a radio frequency integrated circuit (RFIC), and secure Effective Isotropic Radiated Power (EIRP) and the like.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An antenna module and an electronic device including the same.

In one general aspect, an antenna module includes a first antenna unit including at least one first patch antenna pattern, at least one first feed via electrically connected to the at least one first patch antenna pattern, and at least one first dielectric layer surrounding the at least one first feed via; a second antenna unit including at least one second patch antenna pattern, at least one second feed via electrically connected to the at least one second patch antenna pattern, and at least one second dielectric layer surrounding the at least one second feed via; a first connection portion; a first rigid substrate electrically connecting the first connection portion to the first antenna unit and having a first surface on which the first antenna unit is disposed; a base connection portion; a flexible substrate having a first surface on which the first connection portion is disposed and a second surface on which the base connection portion is disposed, electrically connecting the first connection portion to the base connection portion, and being more flexible than the first rigid substrate; and an integrated circuit (IC) electrically connected to the flexible substrate through the second surface of the flexible substrate or a second surface of the first rigid substrate.

At least a portion of at least one of the first connection portion and the base connection portion may have a melting point lower than a melting point of the at least one first feed via.

The antenna module may include an encapsulant encapsulating the IC; and a shielding member surrounding at least a portion of the encapsulant.

The IC may be electrically connected to the flexible substrate through the second surface of the flexible substrate and may be disposed to overlap at least a portion of the first connection portion.

A size of the at least one first patch antenna pattern may be smaller than a size of the at least one second patch antenna pattern.

The antenna module may include a second connection portion disposed on the first surface of the flexible substrate; and a second rigid substrate electrically connecting the second connection portion to the second antenna unit and having a first surface on which the second antenna unit is disposed.

The IC may be disposed to overlap at least a portion of the first connection portion, and a thickness of the first rigid substrate may be greater than a thickness of the second rigid substrate.

A thickness of the first rigid substrate may be greater than a thickness of the flexible substrate.

A size of a portion of the first rigid substrate, which does not overlap the flexible substrate, may be greater than a size of a portion of the first rigid substrate, which does overlap the flexible substrate.

The first antenna unit and the second antenna unit may be spaced apart from each other in a first direction, and the at least one first patch antenna may include a plurality of first patch antenna patterns arranged in a second direction different from the first direction.

The first antenna unit and the second antenna unit may be spaced apart from each other in a first direction, and the flexible substrate may protrude in a second direction different from the first direction.

At least a portion of at least one of the first and second antenna units may overlap a portion of the flexible substrate that protrudes in the second direction.

The flexible substrate may have an L shape or a T shape.

The second antenna unit may include at least one second solder layer disposed between the flexible substrate and the at least one second dielectric layer, at least a portion of the at least one second solder layer having a melting point lower than a melting point of the at least one second feed via, and at least a portion of the second antenna unit may overlap a portion of the flexible substrate protruding in the first direction.

The at least one first dielectric layer may include a plurality of first dielectric layers spaced apart from each other, and the first antenna unit may include a plurality of first solder layers each disposed between the first rigid substrate and a corresponding first dielectric layer among the plurality of first dielectric layers, at least a portion of the plurality of first solder layers having a melting point lower than a melting point of the at least one first feed via.

In another general aspect, an electronic device includes a set substrate; and the antenna module described above, electrically connected to the set substrate, and receiving a base signal from or transmitting a base signal to the set substrate.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1A:
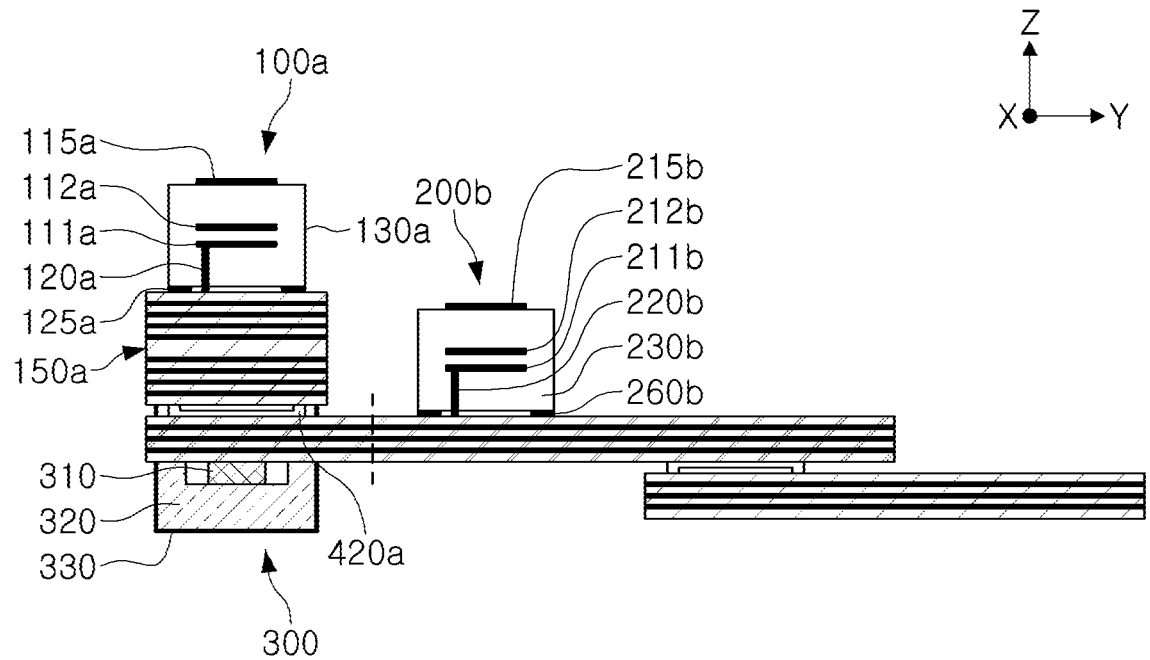
FIG. 1A is a side view illustrating an antenna module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed, as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

Figure 1B:
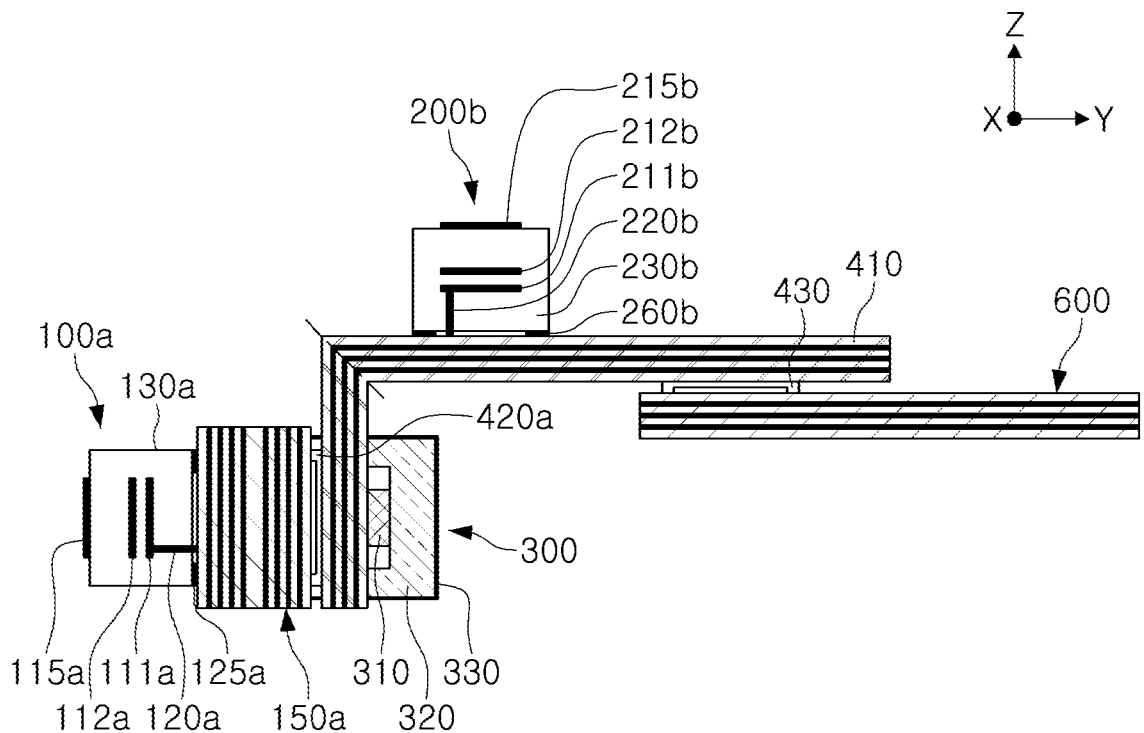
FIG. 1B is a side view illustrating a structure in which a flexible substrate of FIG. 1A is bent.

FIG. 1A is a side view illustrating an antenna module according to an example, and FIG. 1B is a side view illustrating a structure in which a flexible substrate of FIG. 1A is bent.

Referring to FIGS. 1A and 1B, an antenna module according to an example may include a first antenna unit 100a, a second antenna unit 200b, a first connection portion 420a, a first rigid substrate 150a, a base connection portion 430, a flexible substrate 410, and an integrated circuit (IC) 310.

The first antenna unit 100a may include a plurality of first patch antenna patterns 111a, a plurality of first feed vias 120a electrically connected to corresponding first patch antenna patterns among the plurality of first patch antenna patterns 111a, respectively, and at least one first dielectric layer 130a surrounding the plurality of first feed vias 120a.

Accordingly, the first antenna unit 100a may remotely transmit and/or receive a radio frequency (RF) signal in a normal direction (for example, a Z-direction) of upper surfaces of the plurality of first patch antenna patterns 111a.

The gain of the first antenna unit 100a may increase as the number of the plurality of first patch antenna patterns 111a increases.

For example, the first antenna unit 100a further includes a plurality of third patch antenna patterns 112a and may thus have different first and second bandwidths, and further includes a plurality of first coupling patch patterns 115a and may thus have a first bandwidth with a further wide bandwidth.

The second antenna unit 200b may include a plurality of second patch antenna patterns 211b, a plurality of second feed vias 220b electrically connected to corresponding second patch antenna patterns among the plurality of second patch antenna patterns 211b, respectively, and at least one second dielectric layer 230b surrounding the plurality of second feed vias 220b.

Accordingly, the second antenna unit 200b may remotely transmit and/or receive a Radio Frequency (RF) signal in a normal direction of upper surfaces of the plurality of second patch antenna patterns 211b. A gain of the second antenna unit 200b may be increased as the number of the plurality of second patch antenna patterns 211b increases.

For example, the second antenna unit 200b further includes a plurality of fourth patch antenna patterns 212b, thereby having different first and second bandwidths, and further includes a plurality of second coupling patch patterns 215b, thereby having a further wide second bandwidth.

For example, when the flexible substrate 410 is bent, the normal direction of the upper surfaces of the plurality of second patch antenna patterns 211b and the normal direction (for example, a Z direction) of the upper surfaces of the plurality of first patch antenna patterns 111a may be different from each other.

Accordingly, the antenna module according to an example may remotely transmit and/or receive an RF signal in a plurality of different directions.

The first rigid substrate 150a may electrically connect the first connection portion 420a and the first antenna unit 100a to each other and may provide an upper surface on which the first antenna unit 100a is disposed.

The first rigid substrate 150a may have a laminated structure in which at least one wiring layer and at least one insulating layer are alternately laminated. According to the laminated structure of the first rigid substrate 150a, an electrical length between the plurality of first patch antenna patterns 111a and the IC 310 may be easily shortened. For example, the first rigid substrate 150a may have a structure similar to that of a printed circuit board (PCB).

Since the RF signal has a relatively high frequency and a relatively short wavelength as compared with those of a base signal, in signal transmission, there may be relatively more loss in the RF signal than that of the base signal. Since the electrical length between the first antenna unit 100a and the IC 310 may be reduced by the first rigid substrate 150a, when the RF signal is transmitted between the IC 310 and the plurality of first patch antenna patterns 111a, transmission loss of the RF signal may be reduced.

The first rigid substrate 150a may further include a wire, a ground layer, a heat dissipation path, and/or a circuit, which may support operations (for example, frequency conversion, amplification, filtering, and phase control) of the IC 310, by increasing the number of wiring layers/insulating layers, performance of the IC 310 may be efficiently improved.

For example, a thickness of the first rigid substrate 150a may be greater than a thickness of the flexible substrate 410.

Accordingly, the first rigid substrate 150a may further improve the performance of the IC 310.

The flexible substrate 410 provides an upper surface on which the first connection portion 420a is disposed and a lower surface on which the base connection portion 430 is disposed, and electrically connects the first connection portion 420a and the base connection portion 430 to each other, and may be configured to be more flexible than the rigid substrate 150a.

For example, the flexible substrate 410 may have a structure similar to that of a flexible PCB, and may have a relatively flexible insulating layer such as a polyimide layer. In this case, the criterion of flexibility may be defined as an applied force when the measurement object is damaged by applying a force to the center of one surface of a measurement object having a unit size and gradually increasing the force until the measurement object is damaged (for example, cutting, cracks, or the like).

At least a portion of at least one of the first connection portion 420a and the base connection portion 430 may have a melting point lower than a melting point of the plurality of first feed vias 120a.

Accordingly, the first rigid substrate 150a and the flexible substrate 410 may be attached to each other after being manufactured in separate processes, and the flexible substrate 410 and a set substrate 600 may be attached to each other after being manufactured in separate processes.

Therefore, since the arrangement relationship between the first rigid substrate 150a and the flexible substrate 410 may be more free, the arrangement position and/or arrangement direction of the first antenna unit 100a may be designed more freely. The first antenna unit 100a efficiently transmits and receives the RF signal remotely by avoiding external obstacles, for example, other devices in an electronic device, the user's hand of an electronic device, or the like, due to the free positioning position and/or the direction of placement.

For example, the first connection portion 420a and the base connection portion 430 may include tin-based solder having a relatively low melting point, and may have a structure such as solder balls, pins, lands or pads.

The IC 310 is electrically connected to the flexible substrate 410 through a lower surface of the flexible substrate 410.

For example, the IC 310 may generate an RF signal by performing frequency conversion, amplification, filtering, phase control and the like on the base signal, and may generate the base signal from the RF signal in a similar principle. The base signal has a frequency lower than that of the RF signal, and may have a base band frequency or an intermediate frequency (IF).

For example, the IC 310 may be disposed to overlap at least a portion of the first connection portion 420a. Accordingly, since the electrical length between the IC 310 and the first rigid substrate 150a may be further reduced, the first rigid substrate 150a may support the operation of the IC 310 more efficiently.

The size of each of the plurality of first patch antenna patterns 111a may be smaller than that of each of the plurality of second patch antenna patterns 211b.

Accordingly, the wavelength of the RF signal remotely transmitted and received by the first antenna unit 100a may be shorter than a wavelength of the RF signal remotely transmitted and received by the second antenna unit 200b.

Therefore, transmission loss between the IC 310 and the first antenna unit 100a may be greater than transmission loss between the IC 310 and the second antenna unit 200b. Since an electrical distance between the IC 310 and the first antenna unit 100a is shorter than an electrical distance between the IC 310 and the second antenna unit 200b, overall transmission loss between the IC 310 and the first and second antenna units 100a and 200b may be appropriate.

Referring to FIGS. 1A and 1B, the antenna module according to an example may further include an encapsulant 320 encapsulating the IC 310, and a shielding member 330 surrounding at least a portion of the encapsulant 320. At least portions of the IC 310, the encapsulant 320 and the shielding member 330 may form an IC package 300.

For example, the encapsulant 320 may be implemented with a photo imageable encapsulant (PIE), an Ajinomoto build-up film (ABF), an epoxy molding compound (EMC), or the like.

Referring to FIGS. 1A and 1B, the second antenna unit 200b may further include a second solder layer 260b disposed between the flexible substrate 410 and the second dielectric layer 230b, at least a portion of the second solder layer 260b having a melting point lower than a melting point of a plurality of second feed vias 220b.

Accordingly, the second antenna unit 200b may be directly mounted on the flexible substrate 410 without the rigid substrate, and may be more freely disposed on the flexible substrate 410 after being manufactured separately from the flexible substrate 410.

The first antenna unit 100a may further include a first solder layer 125a disposed between the first rigid substrate 150a and the first dielectric layer 130a and having a melting point at least partially lower than a melting point of the plurality of first feed vias 120a.

Accordingly, the first antenna unit 100a may be more freely disposed on the first rigid substrate 150a after being separately manufactured from the first rigid substrate 150a.

Due to the first and second solder layers 125a and 260b, the first and second dielectric layers 130a and 230b may be designed without considering structural compatibility with the flexible substrate 410, and may more easily have a dielectric constant higher than that of the flexible substrate 410.

For example, since the first and second dielectric layers 130a and 230b may be formed of ceramic, the first and second dielectric layers 130a and 230b may have a dielectric constant higher than a dielectric constant of an insulating layer (for example, a polyimide layer) of the flexible substrate 410.

Effective wavelengths of RF signals in the first and second dielectric layers 130a and 230b may be reduced as the dielectric constants of the first and second dielectric layers 130a and 230b increase, and overall sizes of the first and second antenna units 100a and 200b may be further reduced as the effective wavelengths of the RF signals in the first and second dielectric layers 130a and 230b are reduced.

The gain of the first and second antenna units 100a and 200b may be further increased as the number of first and second patch antenna patterns 111a and 211b increases. The overall size of the first and second antenna units 100a and 200b may be proportional to the number of the first and second patch antenna patterns 111a and 211b.

Therefore, the gain compared to the sizes of the first and second antenna units 100a and 200b may be increased as the dielectric constants of the first and second dielectric layers 130a and 230b are increased.

Since the first and second dielectric layers 130a and 230b may be more easily implemented with a material having a relatively high dielectric constant, the antenna module according to an example may have a relatively high gain compared to the size.

Figure 1C:
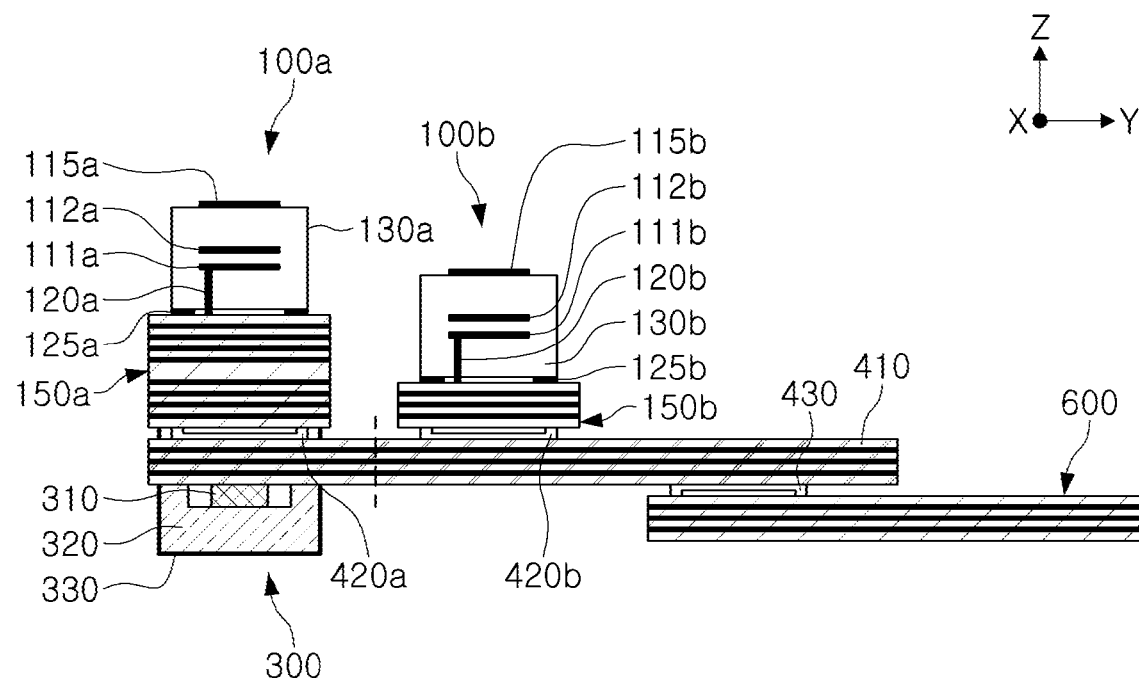
FIG. 1C is a side view illustrating an antenna module and a second rigid substrate according to an example.
Figure 1D:
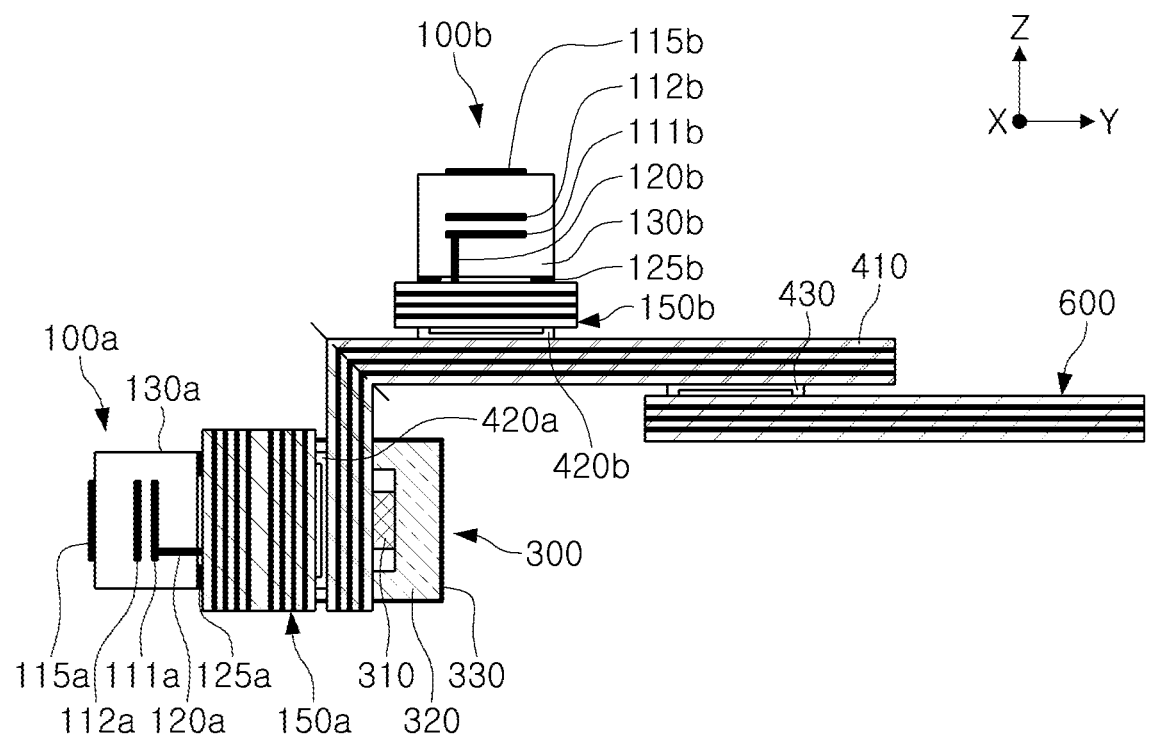
FIG. 1D is a side view illustrating a structure in which a flexible substrate of FIG. 1C is bent.

FIG. 1C is a side view illustrating an antenna module and a second rigid substrate according to an example, and FIG. 1D is a side view illustrating a structure in which the flexible substrate of FIG. 1C is bent.

Referring to FIGS. 1C and 1D, the antenna module according to an example may further include a second connection portion 420b and a second rigid substrate 150b.

The second connection portion 420b may be disposed on an upper surface of the flexible substrate 410 and may have characteristics similar to those of the first connection portion 420a.

The second rigid substrate 150b may be electrically connected between the second connection portion 420b and the second antenna unit 100b and may be provided on an upper surface on which the second antenna unit 100b is disposed.

For example, a thickness of the first rigid substrate 150a may be greater than a thickness of the second rigid substrate 150b. For example, the first rigid substrate 150a may include more wirings, ground layers, heat dissipation paths, and/or circuits that may support operations of the IC 310 than those of the second rigid substrate 150b.

A second antenna unit 100b may include a plurality of second patch antenna patterns 111b, a plurality of second feed vias 120b, a second dielectric layer 130b, and may further include a plurality of fourth patch antenna patterns 112b, a plurality of second coupling patch patterns 115b and a second solder layer 125b.

Figure 1E:
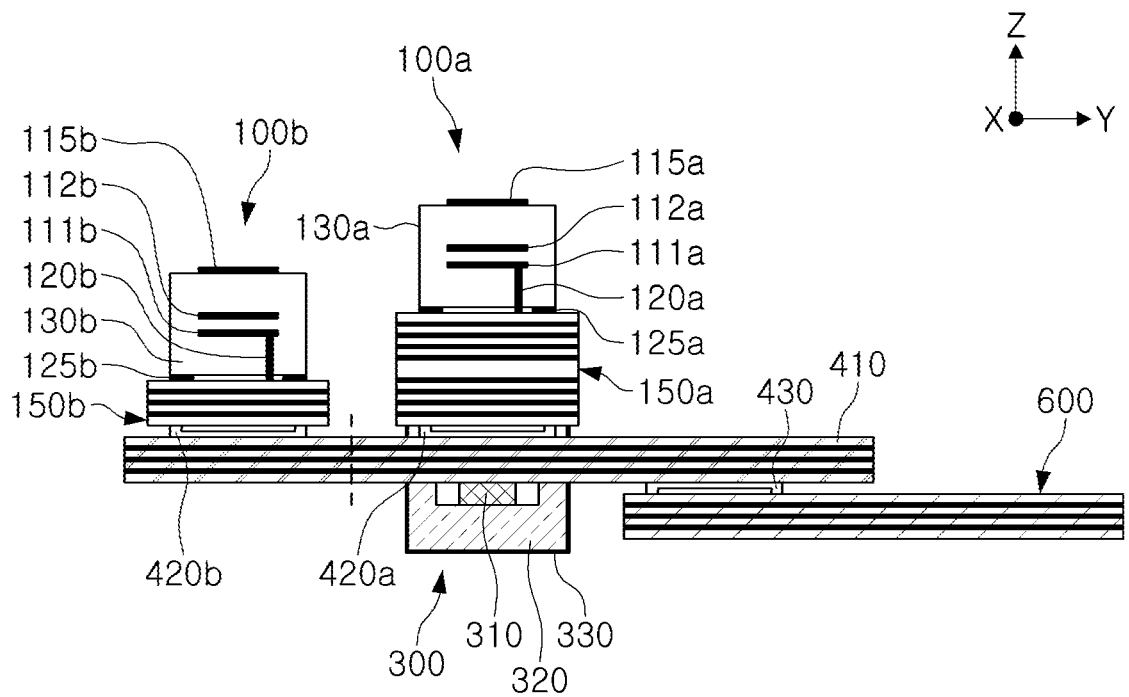
FIG. 1E is a side view illustrating a structure in which the positions of first and second antenna units of an antenna module according to an example are interchanged.
Figure 1F:
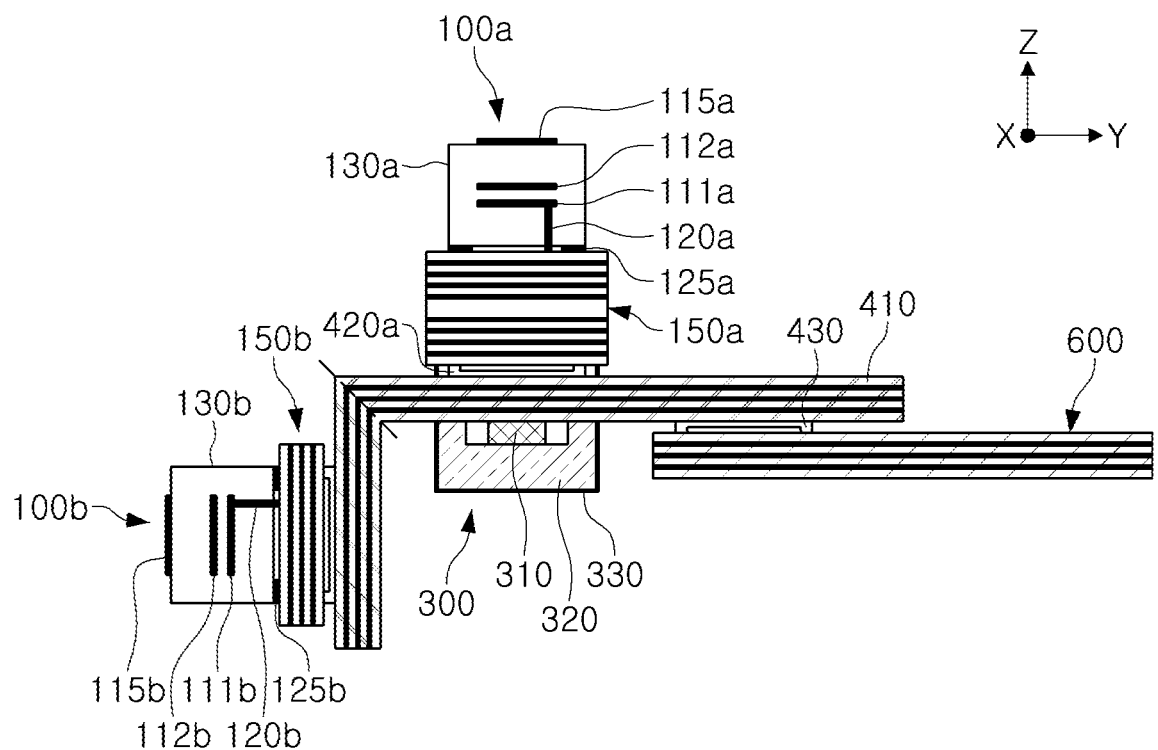
FIG. 1F is a side view illustrating a structure in which a flexible substrate of FIG. 1E is bent.

FIG. 1E is a side view illustrating a structure in which positions of the first and second antenna units of the antenna module according to an example are interchanged, and FIG. 1F is a side view illustrating a structure in which the flexible substrate of FIG. 1E is bent.

Referring to FIGS. 1E and 1F, the position of the first antenna unit 100a and the position of the second antenna unit 100b may be interchanged with each other. For example, a detailed position of the first antenna unit 100a and a detailed position of the second antenna unit 100b may be changed depending on the design.

Figure 2A:
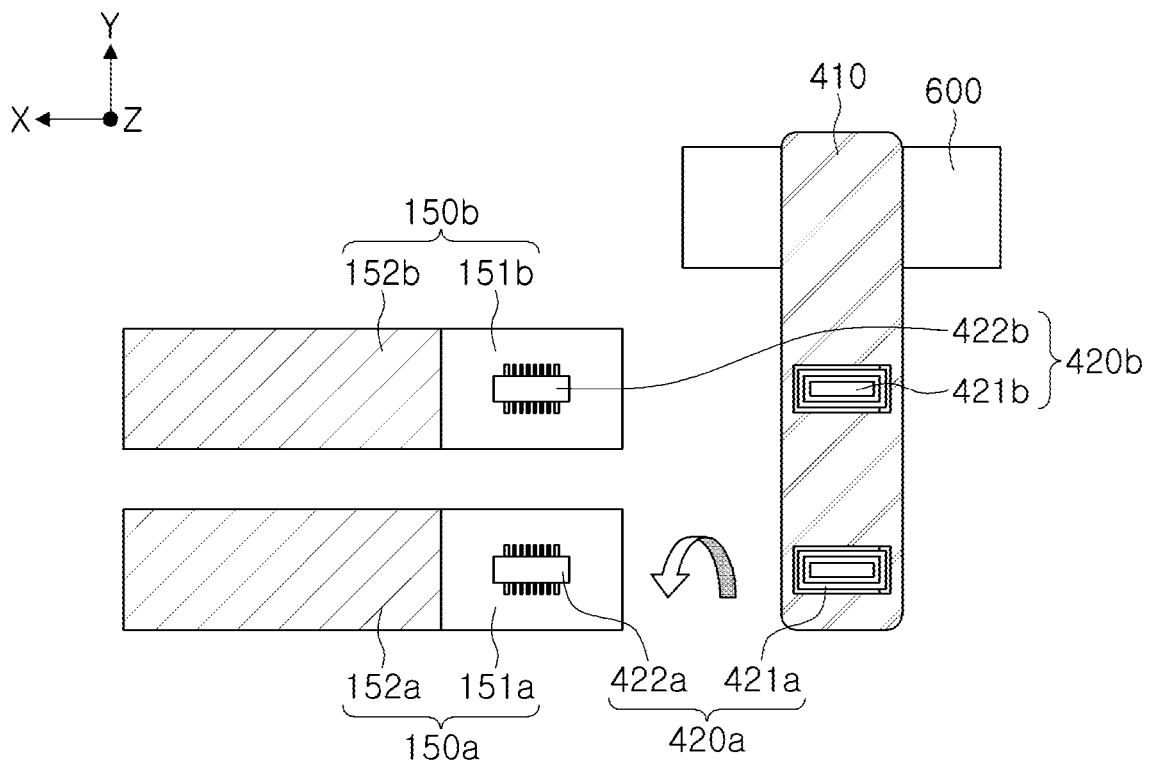
FIG. 2A is a plan view illustrating an antenna module according to an example.
Figure 2B:
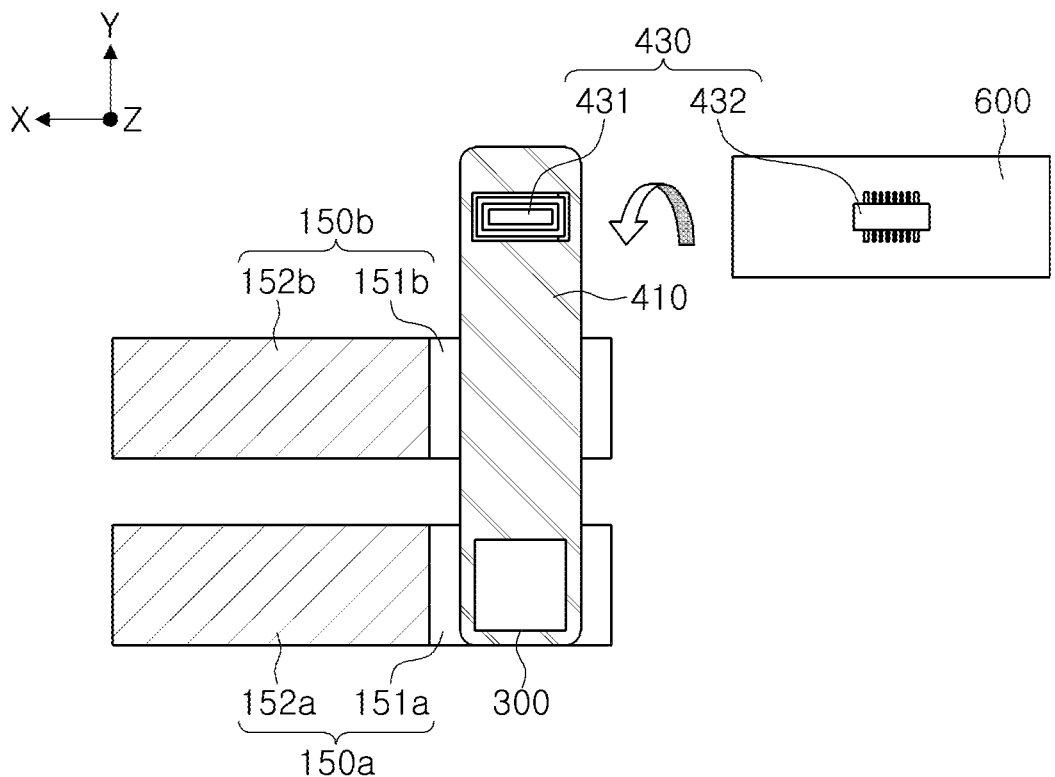
FIG. 2B is a plan view illustrating the connection of first and second connection portions of the antenna module of FIG. 2A.
Figure 2C:
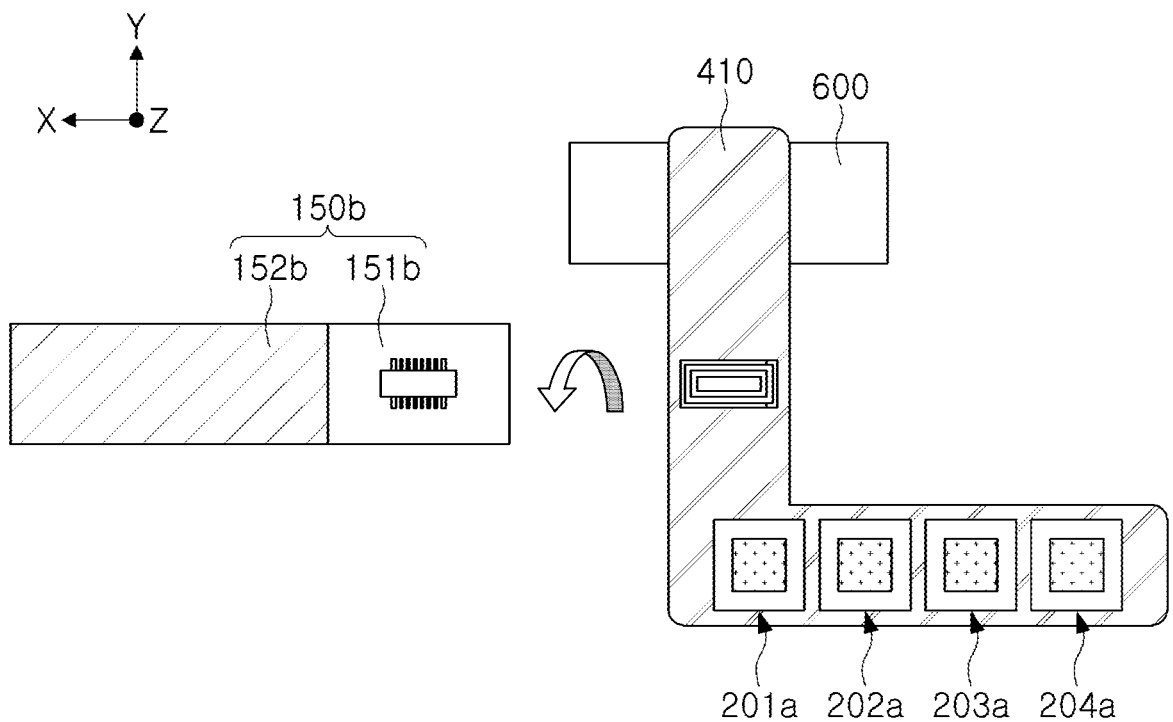
FIG. 2C is a plan view illustrating a modified structure of a first antenna unit of an antenna module according to an example.
Figure 2D:
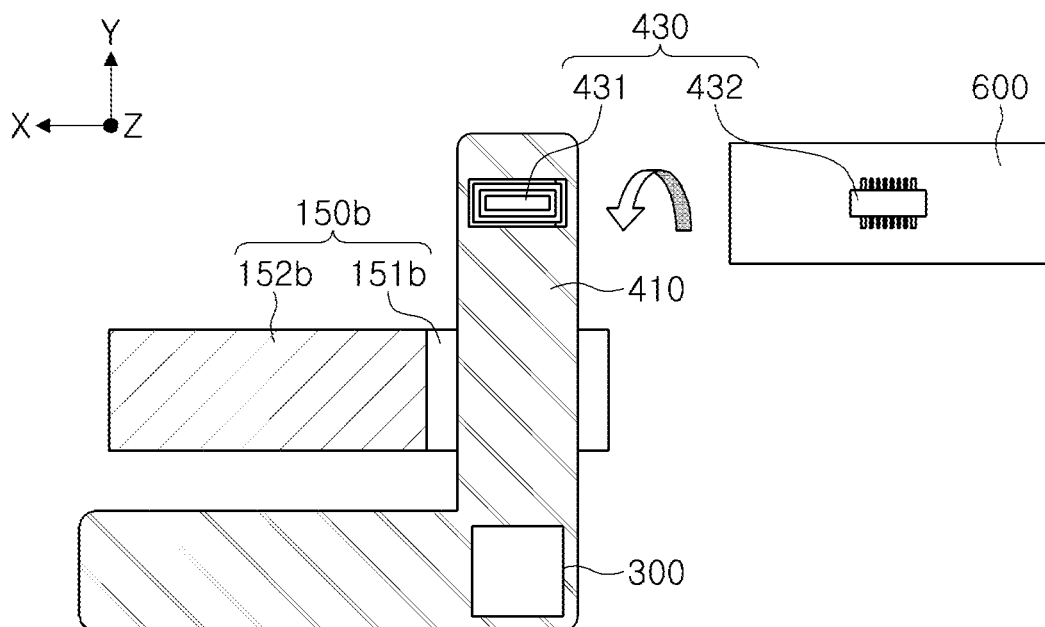
FIG. 2D is a plan view illustrating connection of a second connection portion in the antenna module of FIG. 2C.

FIG. 2A is a plan view illustrating an antenna module according to an example, FIG. 2B is a plan view illustrating connection of first and second connection portions in the antenna module of FIG. 2A, FIG. 2C is a plan view illustrating a modified structure of a first antenna unit of the antenna module according to an example, and FIG. 2D is a plan view illustrating connection of a second connection portion in the antenna module of FIG. 2C.

Referring to FIGS. 2A and 2C, a first connection portion 420a may include a 1-1 connection portion 421a and a 1-2 connection portion 422a, and a second connection portion 420b may include a 2-1 connection portion 421b and a 2-2 connection portion 422b.

The 1-1 connection portion 421a and the 2-1 connection portion 421b may be disposed on a flexible substrate 410, and the 1-2 connection portion 422a may be disposed on a first dielectric layer or a first rigid substrate 150a. The 2-2 connection portion 422b may be disposed on a second dielectric layer or a second rigid substrate 150b.

The 1-1 connection portion 421a and the 1-2 connection portion 422a may be attached to each other, and the 2-1 connection portion 421b and the 2-2 connection portion 422b may be attached to each other.

Referring to FIGS. 2B and 2D, a base connection portion 430 may include a first base connection portion 431 and a second base connection portion 432.

The first base connection portion 431 may be disposed on the flexible substrate 410, and the second base connection portion 432 may be disposed on a set substrate 600.

Referring to FIGS. 2C and 2D, first antenna units 201a, 202a, 203a and 204a may have a structure in which a plurality of chip antennas are arranged.

For example, the first antenna units 201a, 202a, 203a and 204a may have a structure in which a plurality of first dielectric layers are spaced apart from each other.

For example, the first antenna units 201a, 202a, 203a and 204a and the second rigid substrate 150b of the second antenna unit are disposed to be spaced apart from each other in a first direction, for example, a Y direction, and the flexible substrate 410 may protrude in a second direction, for example, an X direction.

The first antenna units 201a, 202a, 203a and 204a may overlap a portion of the flexible substrate 410, protruding in the second direction.

For example, the flexible substrate 410 may have an L shape or a T shape.

Referring to FIGS. 2A, 2B, 2C and 2D, the first rigid substrate 150a may include a 1-1 region 151a overlapping the flexible substrate 410, and a 1-2 region 152a not overlapping the flexible substrate 410, and the second rigid substrate 150b may include a 2-1 region 151b overlapping the flexible substrate 410, and a 2-2 region 152b not overlapping the flexible substrate 410.

In this case, the 1-2 region 152a may be larger than the 1-1 region 151a, and the 2-2 region 152b may be larger than the 2-1 region 151b.

Accordingly, the antenna module according to an example may be disposed more freely on the flexible substrate 410 while having a 4×2 structure.

Referring to FIGS. 2B and 2D, an IC package 300 including an IC may be disposed on a lower surface of the flexible substrate 410.

Accordingly, an average first electrical distance between the IC and each first patch antenna pattern on the first rigid substrate 150a, and an average second electrical distance between the IC and each second patch antenna pattern on the second rigid substrate 150b may be relatively reduced overall, and thus, overall transmission loss between the IC and the first and second antenna units may be reduced.

When the IC package 300 including the IC is disposed on the lower surface of the flexible substrate 410, the flexible substrate 410 may block between the IC and the first or second rigid substrate 150a or 150b irrespective of the bending of the flexible substrate 410, thereby reducing electromagnetic interference between the IC and the first or second rigid substrate 150a or 150b, and improving the overall gain of the first and second antenna units.

Figure 2E:
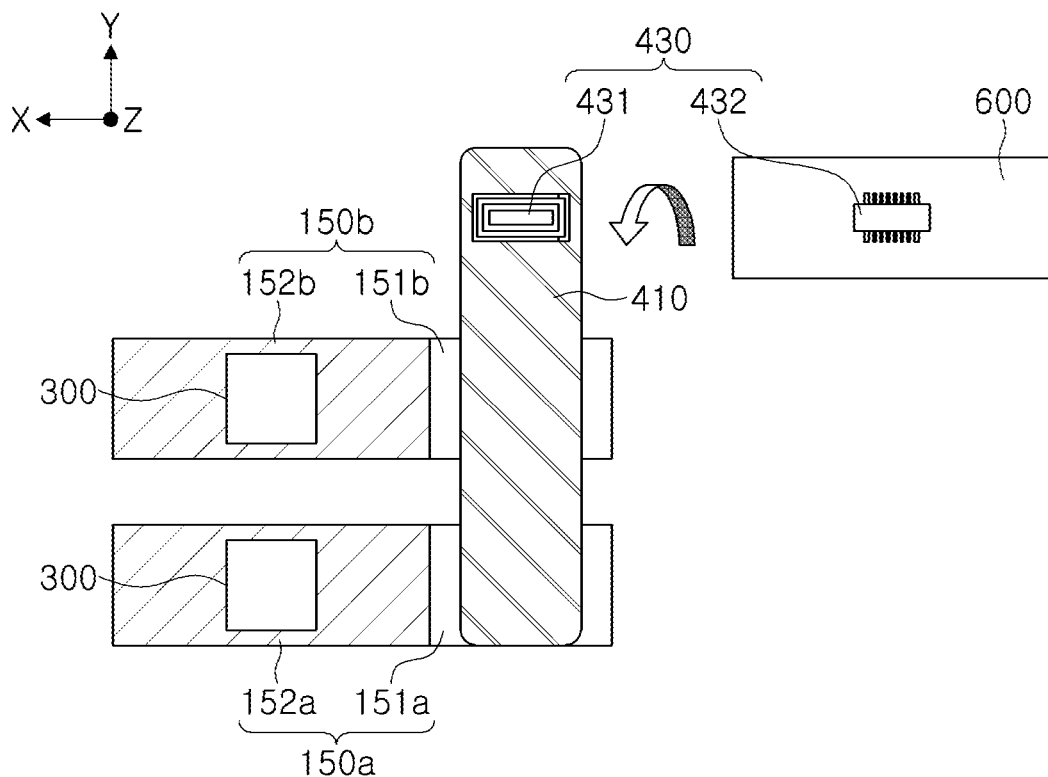
FIGS. 2E and 2F are plan views illustrating a structure in which an IC of an antenna module according to an example is disposed on a lower surface of a rigid substrate.
Figure 2F:
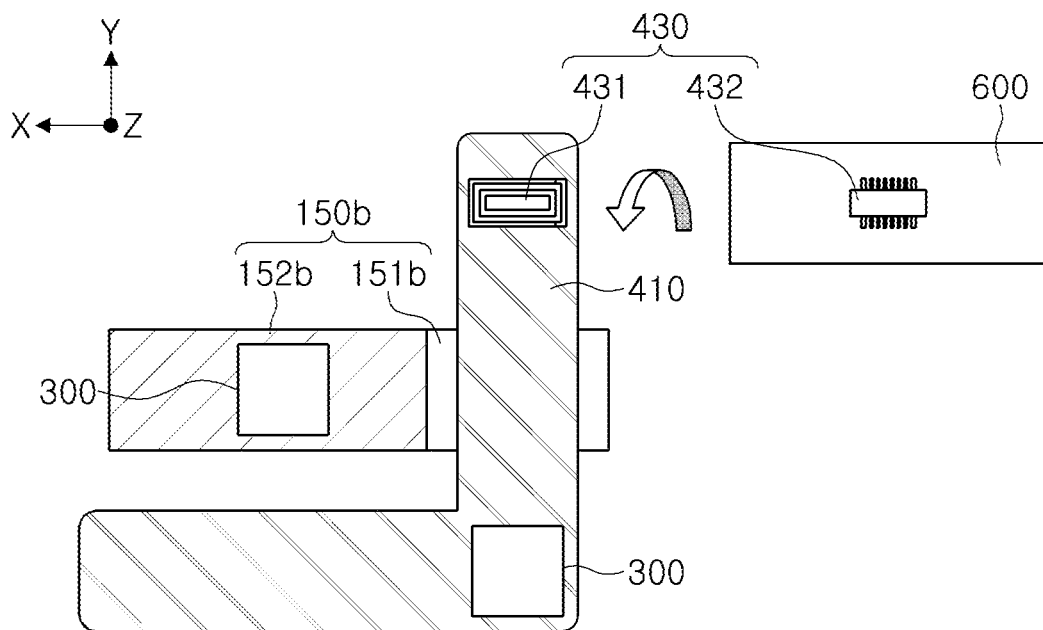

FIGS. 2E and 2F are plan views illustrating a structure in which an IC of an antenna module according to an example is disposed on a lower surface of a rigid substrate.

Referring to FIG. 2E, an IC package 300 including an IC may be disposed on lower surfaces of the first and/or second rigid substrates 150a and 150b. In this case, the number of IC packages 300 may be plural.

Referring to FIG. 2F, the IC package 300 including an IC may be disposed on a lower surface of the second rigid substrate 150b and/or a lower surface of the flexible substrate 410. In this case, the number of IC packages 300 may be plural.

Figure 3A:
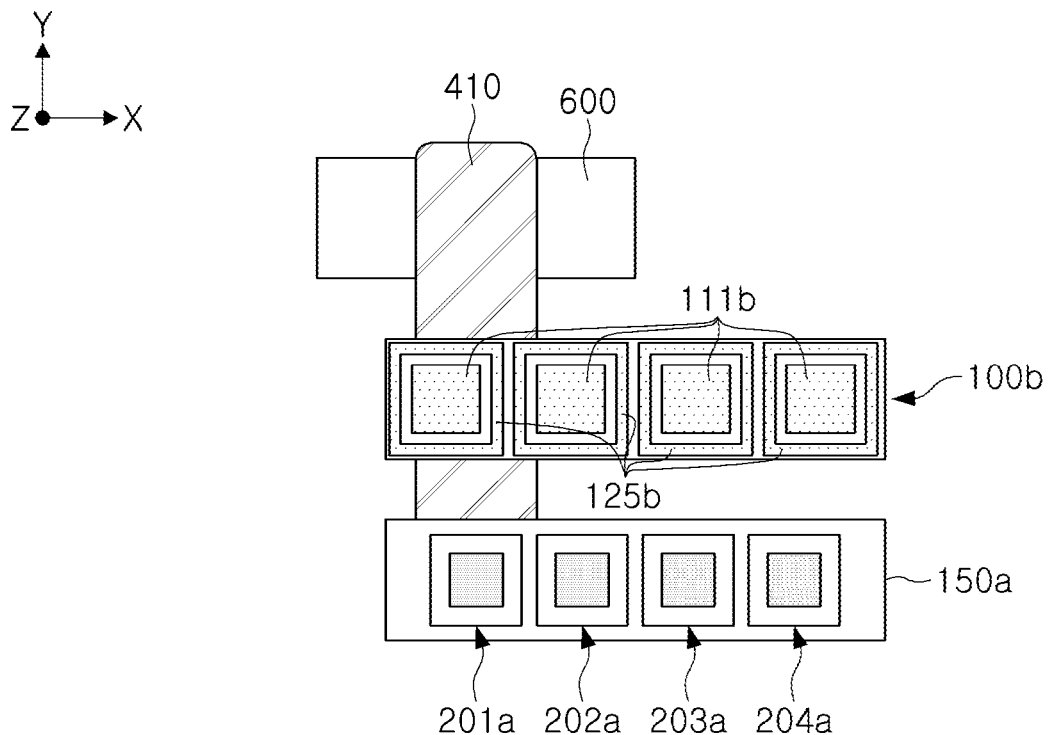
FIG. 3A is a plan view illustrating a first combined structure of first and second antenna units of an antenna module according to an example.

FIG. 3A is a plan view illustrating a first combined structure of first and second antenna units of an antenna module according to an example.

Referring to FIG. 3A, first antenna units 201a, 202a, 203a and 204a have a structure in which a plurality of chip antennas are arranged, and a second antenna unit 100b may have a structure in which a plurality of second patch antenna patterns 111b and a plurality of second solder layers 125b are arranged.

Figure 3B:
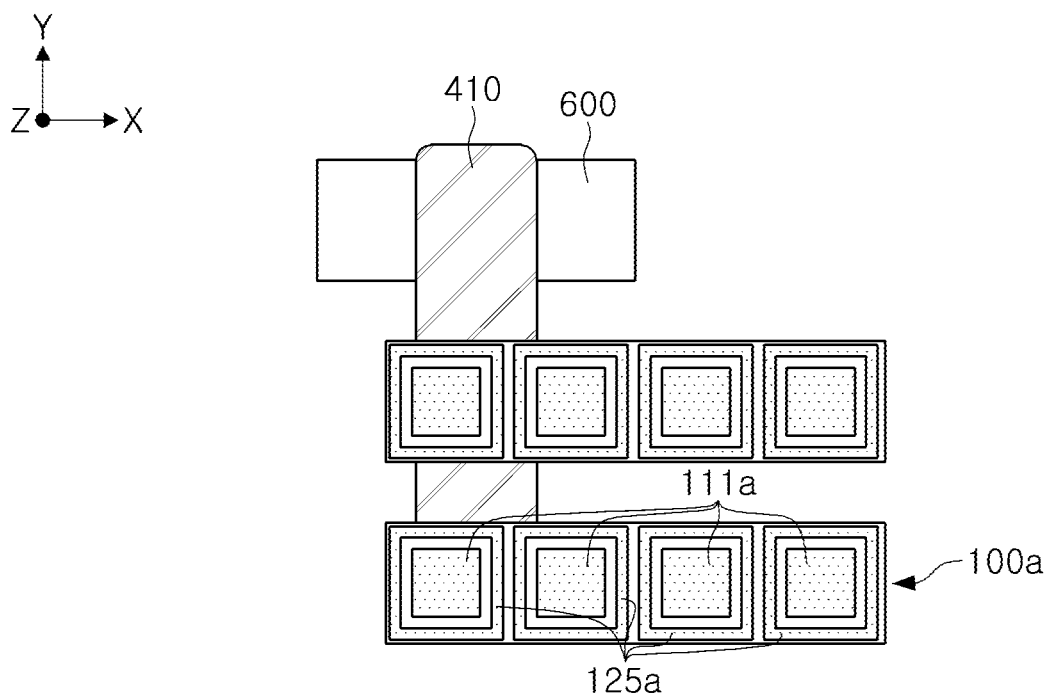
FIG. 3B is a plan view illustrating a second combined structure of the first and second antenna units of the antenna module according to an example.

FIG. 3B is a plan view illustrating a second combined structure of the first and second antenna units of the antenna module according to an example.

Referring to FIG. 3B, the first antenna unit 100a may have a structure in which a plurality of first patch antenna patterns 111a and a plurality of first solder layers 125a are arranged.

Figure 3C:
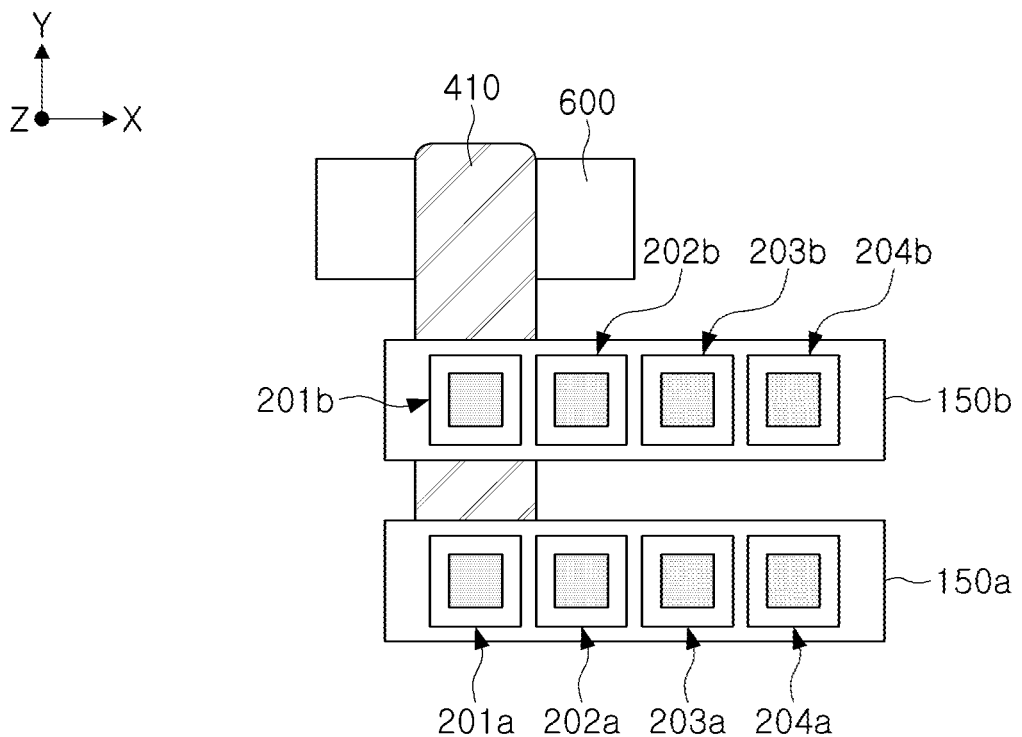
FIG. 3C is a plan view illustrating a third combined structure of the first and second antenna units of the antenna module according to an example.

FIG. 3C is a plan view illustrating a third combined structure of the first and second antenna units of the antenna module according to an example.

Referring to FIG. 3C, first antenna units 201a, 202a, 203a and 204a have a structure in which a plurality of chip antennas are arranged, and second antenna units 201b, 202b, 203b and 204b have a structure in which a plurality of chip antennas are arranged.

Figure 3D:
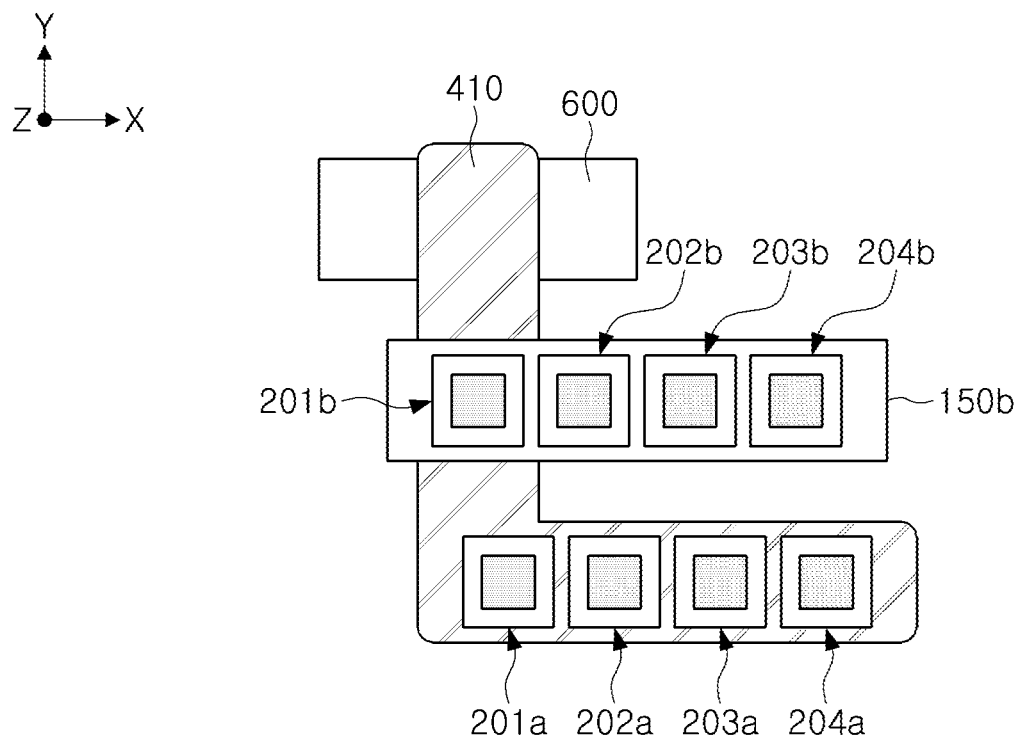
FIG. 3D is a plan view illustrating a fourth combined structure of the first and second antenna units of the antenna module according to an example.

FIG. 3D is a plan view illustrating a fourth combined structure of the first and second antenna units of the antenna module according to an example.

Referring to FIG. 3D, first antenna units 201a, 202a, 203a and 204a have a structure in which a plurality of chip antennas are disposed on the flexible substrate 410, and second antenna units 201b, 202b, 203b and 204b have a structure in which a plurality of chip antennas are disposed on the second rigid substrate 150b.

Figure 3E:
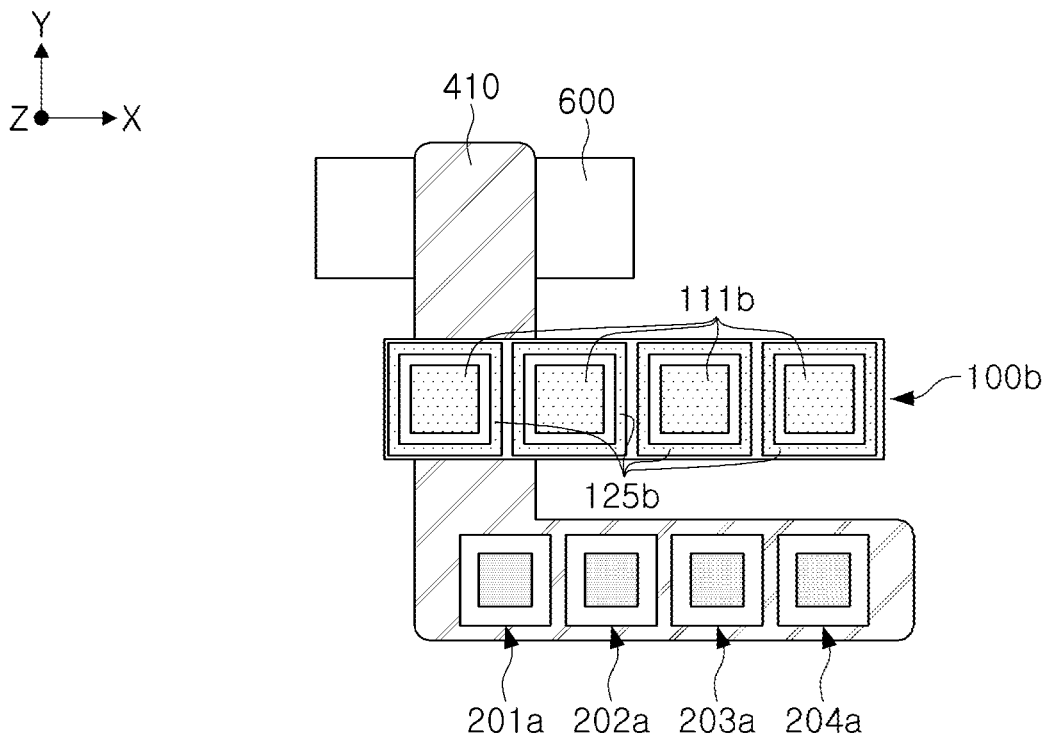
FIG. 3E is a plan view illustrating a fifth combined structure of the first and second antenna units of the antenna module according to an example.

FIG. 3E is a plan view illustrating a fifth combined structure of the first and second antenna units of the antenna module according to an example.

Referring to FIG. 3E, first antenna units 201a, 202a, 203a and 204a have a structure in which a plurality of chip antennas are disposed on the flexible substrate 410, and a second antenna unit 100b has a structure in which a plurality of second patch antenna patterns 111b and a plurality of second solder layers 125b are arranged.

Figure 3F:
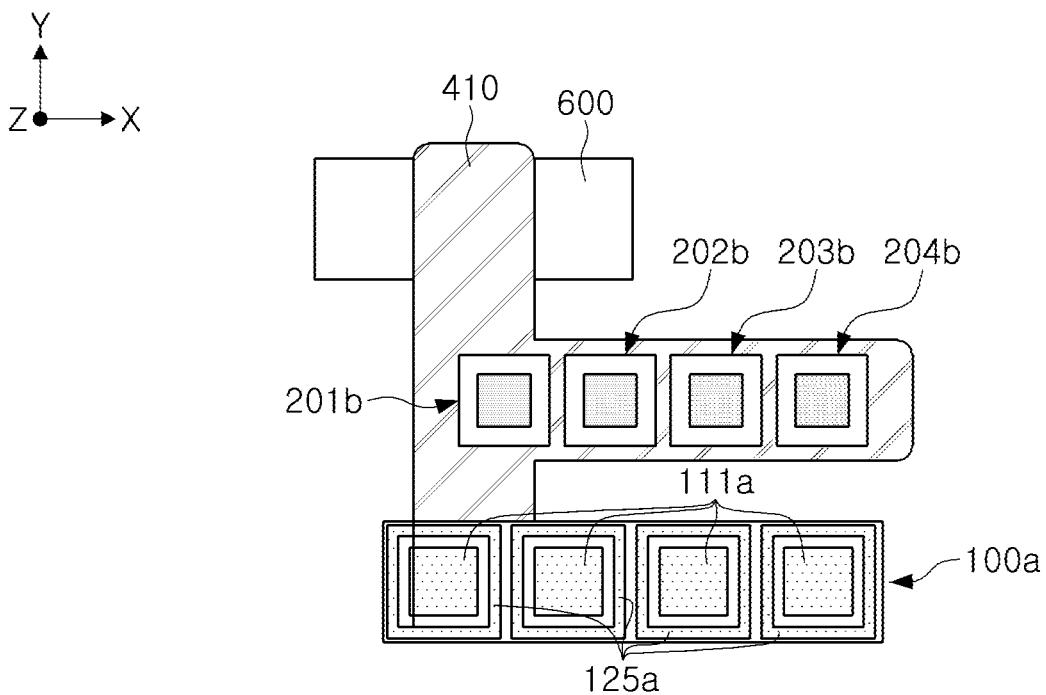
FIG. 3F is a plan view illustrating a sixth combined structure of the first and second antenna units of the antenna module according to an example.

FIG. 3F is a plan view illustrating a sixth combined structure of the first and second antenna units of the antenna module according to an example.

Referring to FIG. 3F, a first antenna unit 100a may have a structure in which a plurality of first patch antenna patterns 111a and a plurality of first solder layers 125a are arranged, and a second antenna unit 100b may have a structure in which a plurality of chip antennas are disposed on the flexible substrate 410.

Figure 4A:
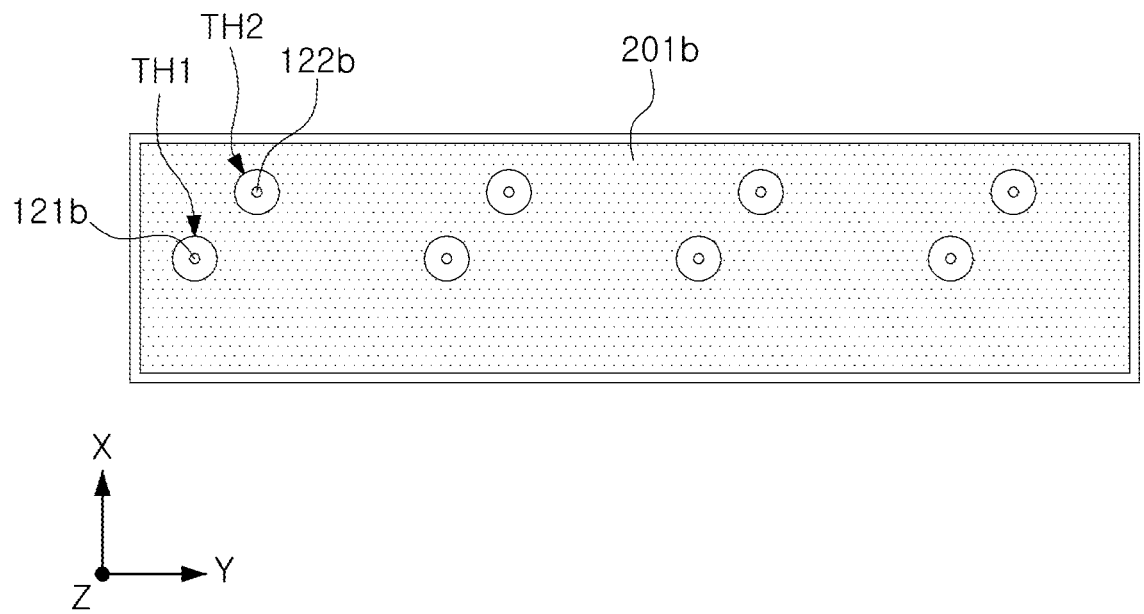
FIGS. 4A, 4B, and 4C are plan views illustrating respective layers of first and second rigid substrates of an antenna module according to an example.
Figure 4B:
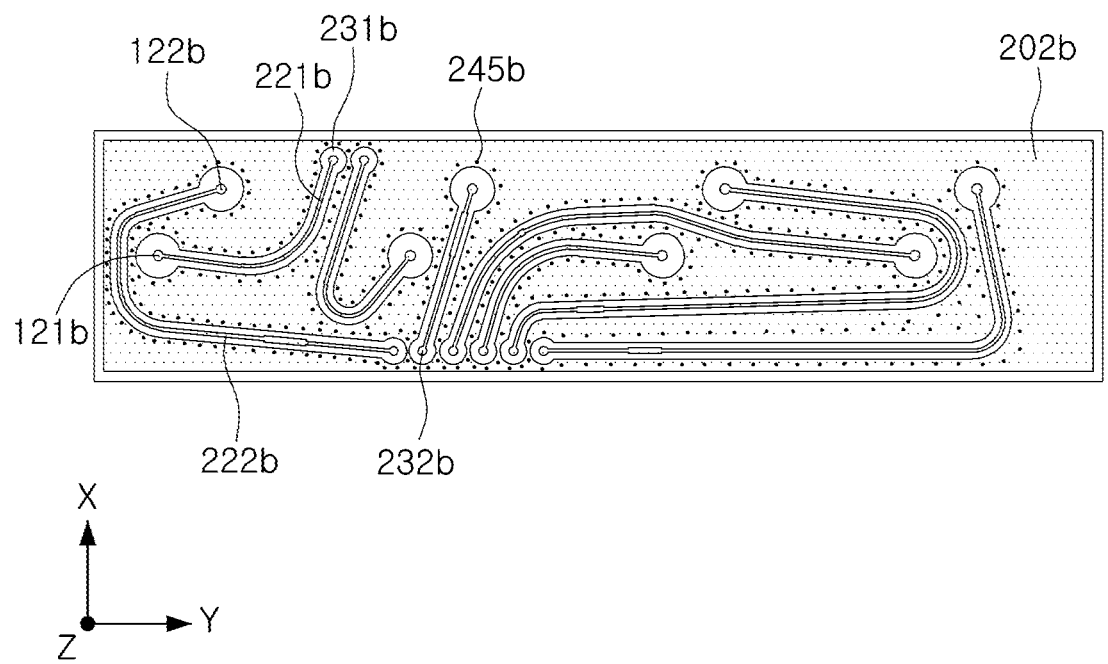
Figure 4C:
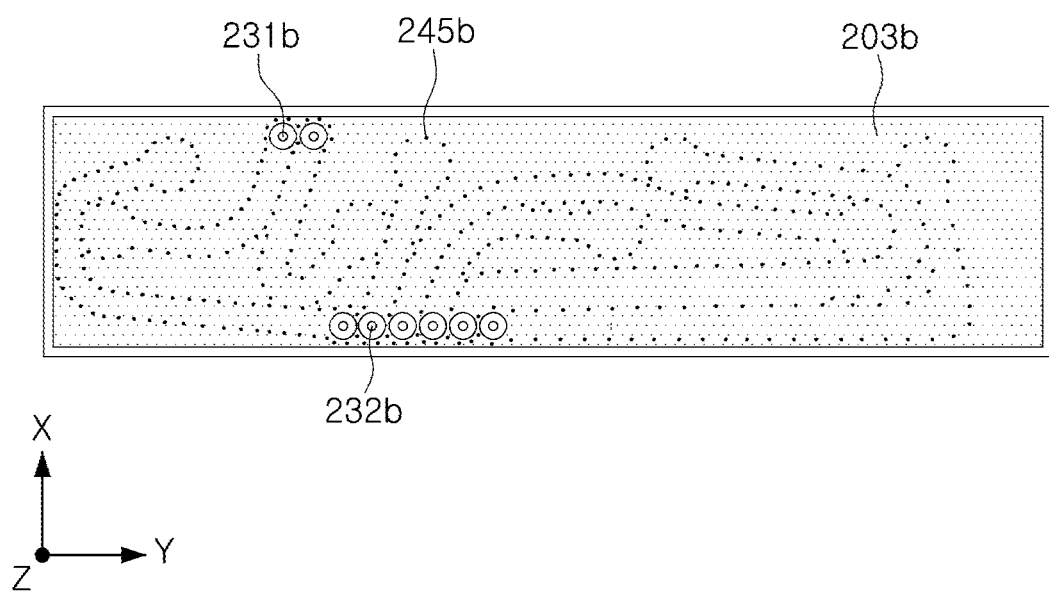

FIGS. 4A, 4B, and 4C are plan views illustrating respective layers of the first and second rigid substrates of the antenna module according to the example.

Referring to FIGS. 4A, 4B, and 4C, a first ground plane 201b may be disposed to be higher (in the Z direction) than a second ground plane 202b, and the second ground plane 202b may be disposed to be higher (in the Z direction) than a third ground plane 203b.

Referring to FIG. 4A, the first ground plane 201b may have a plurality of first and second through-holes TH1 and TH2 through which a plurality of first and second feed vias 121b and 122b penetrate, respectively.

Referring to FIG. 4B, the second ground plane 202b may surround a plurality of first and second feed lines 221b and 222b.

The plurality of first and second feed lines 221b and 222b are electrically connected between the plurality of first and second feed vias 121b and 122b and a plurality of first and second wiring vias 231b and 232b.

A plurality of shield vias 245b may be electrically connected to the second ground plane 202b and may be arranged to surround the plurality of first and second feed lines 221b and 222b.

Referring to FIG. 4C, the third ground plane 203b may have through-holes through which the plurality of first and second wiring vias 231b and 232b penetrate.

The plurality of first and second wiring vias 231b and 232b may be electrically connected to an IC disposed below the third ground plane 203b.

Figure 5A:
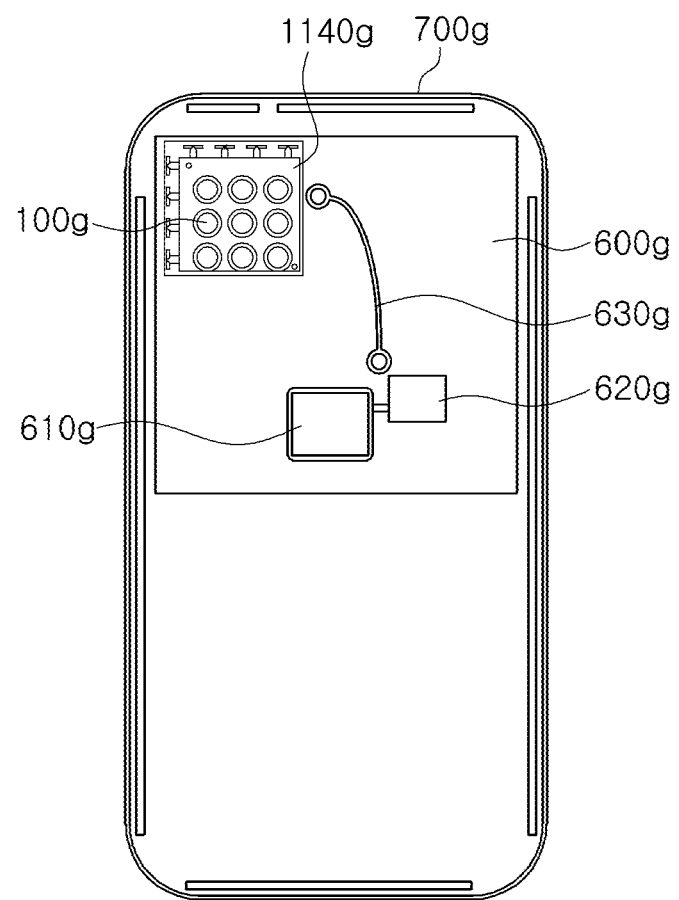
FIGS. 5A, 5B, and 5C are plan views illustrating electronic devices according to examples.
Figure 5B:
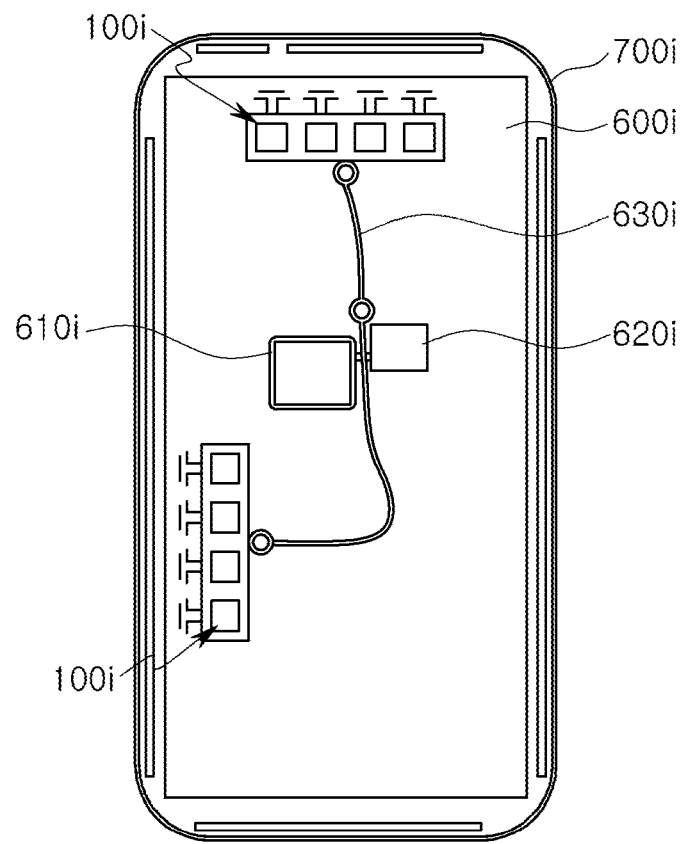
Figure 5C:
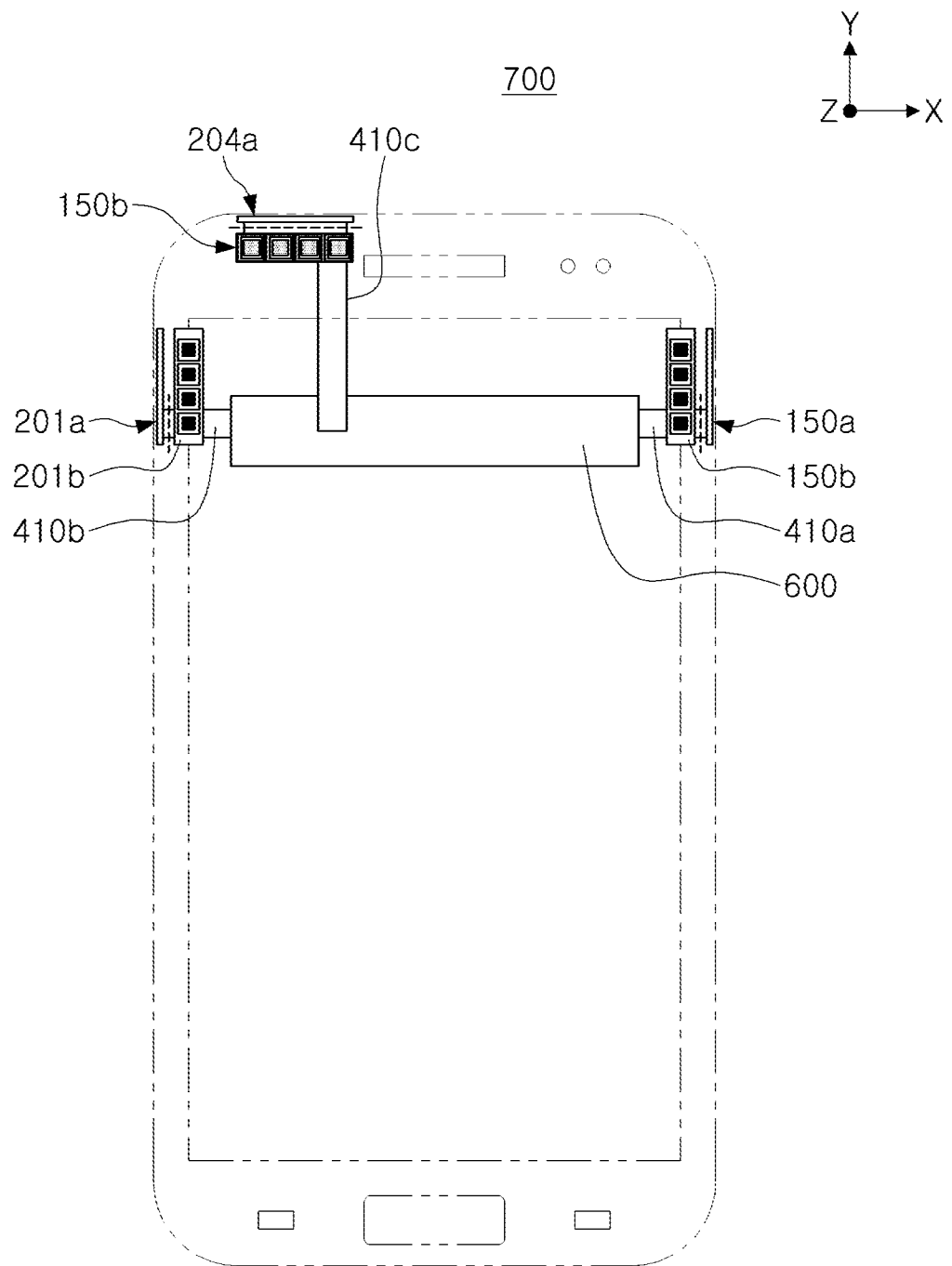

FIGS. 5A, 5B, and 5C are plan views illustrating electronic devices according to examples.

Referring to FIG. 5A, an antenna module including a first antenna unit 100g and a first dielectric layer 1140g may be disposed on a set substrate 600g, and may be disposed in an electronic device 700g according to an example.

The electronic device 700g may be a smartphone, a personal digital assistant, a digital video camera, a digital still camera, a network system, a computer, a monitor, a tablet PC, a laptop computer, a netbook, a television set, a video game, a smartwatch, an automobile, or the like, but is not limited thereto.

A communication module 610g and a second IC 620g may be further disposed on the set substrate 600g. The antenna module may be electrically connected to the communication module 610g and/or the second IC 620g through a coaxial cable 630g.

The communication module 610g may include at least a portion of a memory chip such as a volatile memory (for example, a dynamic random access memory (DRAM)), a nonvolatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like, to perform digital signal processing.

The second IC 620g may perform analog-to-digital conversion, amplification of an analog signal, filtering, and frequency conversion to generate a base signal. The base signal input and output from the second IC 620g may be transmitted to the antenna module through the coaxial cable. For example, when the base signal is an IF signal, the second IC 620g may be implemented as an Intermediate Frequency Integrated Circuit (IFIC). When the base signal is a baseband signal, the second IC 620g may be implemented as a Base Band Integrated Circuit (BBIC).

For example, the base signal may be transmitted to the IC through an electrical connection structure, a core via, and a circuit wiring. The IC may convert the base signal into an RF signal in a millimeter wave (mmWave) band.

Referring to FIG. 5B, a plurality of antenna modules each including first antenna units 100i may be disposed on a set substrate 600i of an electronic device 700i, to be disposed adjacent to one side boundary and the other side boundary of the electronic device 700i, respectively, and a communication module 610i and a second IC 620i may be further disposed on the set substrate 600i. The plurality of antenna modules may be electrically connected to the communication module 610i and/or the second IC 620i through a coaxial cable 630i.

Referring to FIG. 5C, an electronic device 700 according to an example may include a set substrate 600 and a plurality of flexible substrates 410a, 410b and 410c.

The plurality of flexible substrates 410a, 410b and 410c may be electrically connected to a second rigid substrate 150b or a second antenna unit 201b. The second antenna unit 201b may form a radiation pattern in a vertical direction, for example, a Z direction.

The plurality of flexible substrates 410a, 410b and 410c may be electrically connected to a first rigid substrate 150a or first antenna units 201a and 204a, respectively. As the plurality of flexible substrates 410a, 410b and 410c are bent, the first antenna units 201a and 204a may respectively form radiation patterns in a horizontal direction, for example, in an X direction and/or a Y direction.

The first rigid substrate 150a and the first antenna units 201a and 204a may be closer to the edge of the electronic device 700 than the second rigid substrate 150b and the second antenna unit 201b.

The patterns, vias, planes, and wiring layers provided herein may include a metal material, for example, a conductive material, such as copper (Cu), aluminum (Al), silver (Ag), tin (Sn), gold (Au), nickel (Ni), lead (Pb), titanium (Ti), or alloys thereof, and may be formed depending on a plating method, such as chemical vapor deposition (CVD), physical vapor deposition (PVD), sputtering, subtractive, additive, a semi-additive process (SAP), a modified semi-additive process (MSAP), or the like, but examples thereof are not limited thereto. For example, the examples thereof may be changed depending on design specifications (for example, flexibility, a dielectric constant, ease of bonding between a plurality of substrates, durability, cost, or the like).

On the other hand, the insulating layer and/or the dielectric layer herein may be implemented using a thermoplastic resin, a thermosetting resin such as prepreg, FR4, LTCC, LCP, polyimide, an epoxy resin or the like, or a resin in which these resins are impregnated into a core material such as glass fiber, glass cloth, glass fabric or the like, together with an inorganic filler, Ajinomoto Build-up Film (ABF), Bismaleimide Triazine (BT), Photo Imageable Dielectric (PID) Resin, a general Copper Clad Laminate (CCL), a ceramic-based insulating material, or the like.

The RF signals according to the examples may be used in various communications protocols such as Wi-Fi (IEEE 802.11 family or the like), WiMAX (IEEE 802.16 family or the like), IEEE 802.20, Long Term Evolution (LTE), Ev-DO, HSPA+, HSDPA+, HSUPA+, EDGE, GSM, GPS, GPRS, CDMA, TDMA, DECT, Bluetooth, 3rd Generation (3G), 4G, 5G and various wireless and wired protocols designated thereafter, but an example thereof is not limited thereto. In this case, the frequency, for example, 24 GHz, 28 GHz, 36 GHz, 39 GHz, or 60 GHz, of the RF signal is greater than the frequency, for example, 2 GHz, 5 GHz, 10 GHz or the like, of the IF signal.

As set forth above, according to the examples, antenna performance (for example, gain, a bandwidth, directivity, or the like) may be improved, or miniaturized structure may be provided. RF signal transmission and reception directions may be easily widened without substantially sacrificing antenna performance or size, and RF signals may be efficiently remotely transmitted and received by easily avoiding external obstacles, for example, other devices in an electronic device, the user's hand in the electronic device, or the like.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna module, comprising:
a flexible substrate;
an integrated circuit (IC);
an antenna unit comprising one or more dielectric layers, wherein the antenna unit is disposed closer to a first end of the flexible substrate than a second end of the flexible substrate; and
a base connection portion disposed closer to the second end of the flexible substrate than the first end of the flexible substrate, and electrically connected to the antenna unit through the flexible substrate,
wherein the antenna unit and the base connection portion are disposed on at least one of a first surface of the flexible substrate and a second surface of the flexible substrate,
wherein the at least one of the first surface of the flexible substrate and the second surface of the flexible substrate has a form such that an extending direction between the first end of the flexible substrate and the second end of the flexible substrate is bent in a lateral direction of the at least one of the first surface of the flexible substrate and the second surface of the flexible substrate in a plan view.

2. The antenna module of claim 1, wherein the at least one of the first surface of the flexible substrate and the second surface of the flexible substrate has a form such that the extending direction is different from a straight direction between the first end of the flexible substrate and the second end of the flexible substrate.

3. The antenna module of claim 1, wherein the one or more dielectric layers comprise two or more dielectric layers, and
wherein the at least one of the first surface of the flexible substrate and the second surface of the flexible substrate has a form such that a straight direction between the first end of the flexible substrate and the second end of the flexible substrate is oblique to an arrangement direction of the two or more dielectric layers.

4. The antenna module of claim 3, wherein the at least one of the first surface of the flexible substrate and the second surface of the flexible substrate has a form such that the extending direction is perpendicular to the arrangement direction of the two or more dielectric layers.

5. The antenna module of claim 1, wherein the flexible substrate is configured to have a flexibility that is greater than a flexibility of the one or more dielectric layers.

6. The antenna module of claim 1, wherein the flexible substrate has a protruding portion that protrudes in the lateral direction of the at least one of the first surface of the flexible substrate and the second surface of the flexible substrate and overlaps at least a portion of the one or more dielectric layers.

7. The antenna module of claim 1, wherein the flexible substrate comprises a feed via electrically connected to one or more of the one or more dielectric layers.

8. An electronic device, comprising:
the antenna module of claim 1; and
a set substrate electrically connected to the base connection portion.

9. An antenna module, comprising:
a flexible substrate;
an integrated circuit (IC);
an antenna unit comprising one or more dielectric layers, wherein the antenna unit is disposed closer to a first end of the flexible substrate than a second end of the flexible substrate; and
a base connection portion disposed closer to the second end of the flexible substrate than the first end of the flexible substrate, and electrically connected to the antenna unit through the flexible substrate,
wherein the antenna unit and the base connection portion are disposed on at least one of a first surface of the flexible substrate and a second surface of the flexible substrate,
wherein the flexible substrate has a protruding portion that protrudes in a lateral direction of the at least one of the first surface of the flexible substrate and the second surface of the flexible substrate in a plan view and overlaps at least a portion of the one or more dielectric layers.

10. The antenna module of claim 9, wherein the one or more dielectric layers comprise two or more dielectric layers, and
wherein a protruding direction of the protruding portion and an arrangement direction of the two or more dielectric layers are substantially the same.

11. The antenna module of claim 9, wherein the one or more dielectric layers comprise two or more dielectric layers, and
wherein an arrangement direction of the two or more dielectric layers is different from an extending direction between the protruding direction and the base connection portion.

12. The antenna module of claim 9, wherein the one or more dielectric layers comprise two or more dielectric layers, and
wherein a distance in an arrangement direction of the two or more dielectric layers is longer than a width of an extending portion between the protruding direction and the base connection portion.

13. The antenna module of claim 9, wherein the at least one of the first surface of the flexible substrate and the second surface of the flexible substrate has an L shape or a T shape.

14. The antenna module of claim 9, wherein the flexible substrate is configured to have a flexibility that is greater than a flexibility of the one or more dielectric layers.

15. The antenna module of claim 9, wherein the flexible substrate comprises a feed via that is electrically connected to one or more of the one or more dielectric layers.

16. An electronic device, comprising:
the antenna module of claim 9; and
a set substrate electrically connected to the base connection portion.

17. An antenna module comprising:
an integrated circuit (IC);
a flexible substrate comprising a main surface that extends from a first end of the flexible substrate along a first portion of the flexible substrate to an edge radius in the main surface, extending along the edge radius to a protrusion portion, and extending along the protrusion portion to a second end of the flexible substrate in a plan view;
a base connector disposed on the flexible substrate, and overlapping the first portion; and
an antenna unit disposed closer to the second end of the flexible substrate than the base connector, electrically connected to the base connector through the flexible substrate, and comprising one or more dielectric layers that overlap a second portion of the flexible substrate.

18. The antenna module of claim 17, wherein the first portion and the protrusion portion are disposed at a predetermined angle from each other.

19. The antenna module of claim 17, wherein the one or more dielectric layers comprise two or more dielectric layers disposed along a direction oblique to a direction from the first end of the flexible substrate to the second end of the flexible substrate.

20. The antenna module of claim 17, wherein the one or more dielectric layers comprise two or more dielectric layers disposed along a direction substantially the same as an extending direction of the protrusion portion.

21. The antenna module of claim 17, wherein the flexible substrate is configured to have a flexibility that is greater than a flexibility of the one or more dielectric layers.

22. The antenna module of claim 17, wherein the flexible substrate comprises a feed via electrically connected to one or more of the one or more dielectric layers.

23. An electronic device, comprising:
the antenna module of claim 17; and
a set substrate electrically connected to the base connector.

* * * * *